US006287951B1

(12) United States Patent
Lucas et al.

(10) Patent No.: US 6,287,951 B1
(45) Date of Patent: Sep. 11, 2001

(54) PROCESS FOR FORMING A COMBINATION HARDMASK AND ANTIREFLECTIVE LAYER

(75) Inventors: Kevin D. Lucas; Christopher D. Pettinato, both of Austin; Wayne D. Clark, Driftwood; Stanley M. Filipiak, Pflugerville; Yeong Jyh Lii, Austin, all of TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/206,715

(22) Filed: Dec. 7, 1998

(51) Int. Cl.[7] .................................................. H01L 21/4763
(52) U.S. Cl. ........................ 438/618; 438/636; 438/637; 438/675
(58) Field of Search ..................................... 438/597, 618, 438/622, 631, 633, 636, 637, 706, 707, 710, 735, 737, 738

(56) References Cited

U.S. PATENT DOCUMENTS

| | | | |
|---|---|---|---|
| 5,972,722 | * | 10/1999 | Visokay et al. . |
| 6,008,123 | * | 12/1999 | Kook et al. . |
| 6,019,906 | * | 2/2000 | Jang et al. . |
| 6,020,091 | * | 2/2000 | Lee . |
| 6,027,861 | * | 2/2000 | Yu et al. . |
| 6,030,541 | * | 2/2000 | Adkisson et al. . |
| 6,060,380 | * | 5/2000 | Subramanian et al. . |
| 6,069,091 | * | 5/2000 | Chang et al. . |
| 6,077,742 | * | 6/2000 | Chen et al. . |
| 6,077,769 | * | 6/2000 | Huang et al. . |
| 6,171,945 | * | 1/2001 | Mandal et al. . |

OTHER PUBLICATIONS

Lee, et al., "Dielectric Anti–Reflection Coating Application in a 0.175 μm Dual–Damascene Process", International Interconnect Technology Conference; pp. 98–87 through 98–89 (1998).

Azuma, et al., "Impact of reduced resist thickness on deep ultraviolet lithography", J. Vac. Sci. Technol. B 14(6), Nov./Dec.; pp. 4246–4251 (1996).

Czech, et al., "Reduction of Linewidth Variation of the Gate Conductor Level by Lithography Based on a New Antireflective Layer", Microelectronic Engineering 21; pp. 51–56 (1993) Apr.

* cited by examiner

Primary Examiner—Charles Bowers
Assistant Examiner—Stephen W. Smoot
(74) Attorney, Agent, or Firm—Robert A. Rodriguez

(57) ABSTRACT

A hardmask layer (34) is formed over insulating layers (26, 24, 22 and 20), and an antireflective layer (36) is formed overlying the hardmask layer (34). A resist layer (38) is formed overlying the antireflective layer (36), and an opening is formed in the resist layer to expose a surface portion of the antireflective layer (36). The exposed surface portion of the antireflective layer (36) and portions of the hardmask layer (34) are etched to expose a surface portion of the insulating layers (26, 24, 22 and 20), and a feature opening (61) is formed in the insulating layers (26, 24, 22 and 20). A conductive material (74) is deposited to fill the feature opening (61), and portions of the conductive material (74) lying outside the opening are removed.

20 Claims, 8 Drawing Sheets

PROCESS FOR FORMING A COMBINATION HARDMASK AND ANTIREFLECTIVE LAYER

RELATED APPLICATIONS

This application is related to U.S. Pat. No. 6,184,073, "Semiconductor Device, Memory Cell and Processes For Forming Them," filed Dec. 23, 1997; U.S. Pat. No. 5,918,147, "Process For Forming A Semiconductor Device With An Antireflective Layer," filed Mar. 29, 1995; and U.S. Pat. No. 5,539,249, "Method And Structure For Forming An Integrated Circuit Pattern On A Semiconductor Substrate," filed on Sep. 20, 1994, all of which are assigned to the current assignee hereof and are hereby incorporated by reference.

FIELD OF THE INVENTION

The present invention relates generally to a process for forming a semiconductor device, and more particularly, to methods for forming semiconductor device interconnects.

RELATED ART

Reducing semiconductor device feature geometries is becoming increasingly important in order to reduce the size and increase the speed of integrated circuits. Inlaid interconnect trenches and contacts are examples of such features. Inlaid interconnect trenches are typically used to form the metallization levels of an integrated circuit, and inlaid contacts are used to provide electrical connections between the various metallization levels.

During the formation of the interconnect trench and contact openings, it is desirable to maintain consistent and reproducible dimensions between the top and bottom portions of the opening. However, conventional patterning and etching techniques often result in undesirable patterning variations and slope of the etched features. For example, resist is typically eroded during the etch process that defines the feature opening. Depending on the etch time, etch chemistry, and the resist thickness, the resist erosion translates to varying degrees of erosion of the etched feature. The erosion produces sloping sidewalls that can be nonuniformly distributed across the wafer.

Increasing the thickness of the resist can reduce erosion-related problems, however, this requires increasing the resist exposure time, and reduces throughput. In addition, increasing the thickness of the resist negatively impacts the lithography process because it increases the depth of focus requirements during the exposure processing step. Also, increasing the thickness of the resist complicates the etching process because it further increases the aspect ratio of the feature being etched.

Another source of patterning variation includes the reflection from underlying topography. This reflected radiation, in effect, increases the radiation dose of the resist in areas where reflections are more prevalent. This can increase the size of, or distort, the resist feature opening. Underlying films having higher reflectivity and non-planar surfaces are more prone to produce problems with reflected radiation. Problems associated with reflectivity typically increase as the number of interconnect levels and the density of features in the underlying topography increase.

The prior art has shown that depositing approximately 60 to 140 nanometers of silicon oxynitride, prior to forming and patterning the resist layer, reduces reflectivity problems associated with underlying topography. However, this also makes it necessary to increase the thickness of the resist layer to accommodate etching through the added film. In addition, the combination of the added antireflective layer and the thicker resist contribute to an increase in the overall aspect ratio of the feature during etching, which increases the difficulty of etching it.

BRIEF DESCRIPTION OF THE DRAWINGS

The present invention is illustrated by way of example and not limitation in the accompanying figures, in which like references indicate similar elements, and in which.

Skilled artisans appreciate the elements in the figures are illustrated for simplicity and clarity and have not necessarily been drawn to scale. For example, some of the elements in the figures can be exaggerated relative to other elements to help improve understanding of embodiment(s) of the present invention.

DETAILED DESCRIPTION

In accordance with embodiments of the present invention, a hardmask layer is formed over an insulating layer, and an antireflective layer is formed overlying the hardmask layer. A resist layer is formed overlying the antireflective layer, and an opening is formed in the resist layer to expose a surface portion of the antireflective layer. The exposed surface portion of the antireflective layer and portions of the hardmask layer are etched to expose a surface portion of the insulating layer, and a feature opening is formed in the insulating layer. A conductive material is deposited to fill the feature opening, and portions of the conductive material lying outside the opening are removed. Advantages of embodiments of the present invention will become clear from the following detailed description and will be hereafter described.

Figure 1:
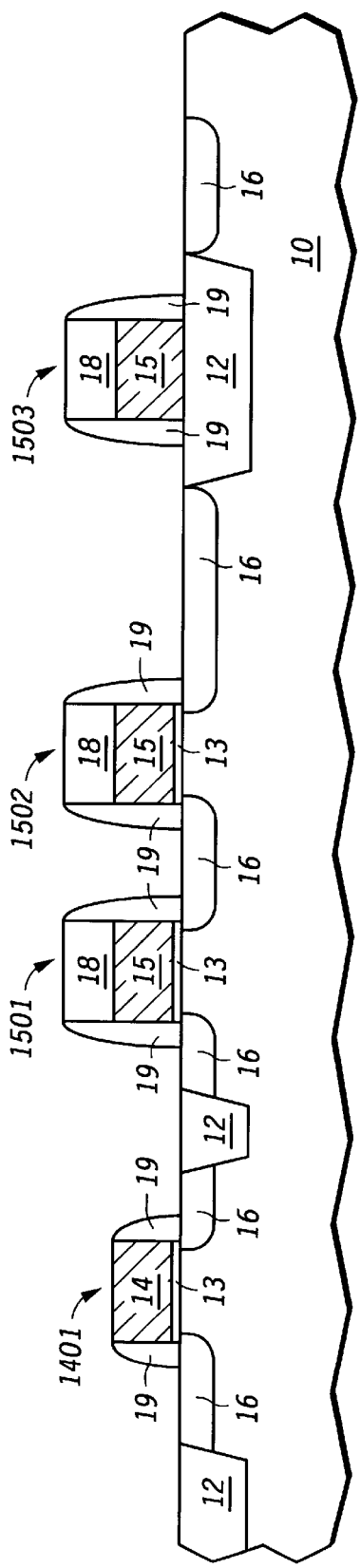
FIG. 1 includes an illustration of a cross-sectional view of a first level of conductive interconnects including a gate electrode formed over a semiconductor substrate.

FIG. 1 includes an illustration of a semiconductor device that has been partially processed to define a first level of conductive interconnects including a gate electrode. The partially processed semiconductor device includes a semiconductor device substrate 10, isolation regions 12, doped regions 16, a transistor 1401, and conductive interconnects 1501, 1502 and 1503. Transistor 1401 includes gate dielectric 13, gate electrode 14, nitride spacers 19 and doped regions 16 adjacent the gate electrode 14. Conductive interconnects 1501–1503 include dielectric 13, conductive members 15, capping layer 18, and nitride spacers 19.

As used in this specification, a semiconductor device substrate 10 includes a monocrystalline semiconductor wafer, a semiconductor-on-insulator wafer, or any other type of substrate used to form semiconductor devices. In one embodiment, isolation regions 12 are trench isolation regions formed using conventional etching and chemical mechanical polishing techniques. Alternatively, isolation regions 12 can be field oxide regions formed using a conventional method, such as local oxidation of silicon (LOCOS), plasma-enhanced LOCOS (PELOX), and the like.

In one embodiment, gate dielectric layer 13 is formed overlying semiconductor device substrate 10 using conventional methods and materials. Gate electrode 14 and conductive interconnects 1501–1503 are formed using polysilicon. Alternatively, gate electrode 14 and conductive interconnects 1501–1503 can be formed from a metal, such as tungsten or molybdenum, a metal nitride, such a titanium nitride or tungsten nitride, or a combination thereof. In addition, gate electrode 14 and conductive interconnects 1501–1503 can be a polycide layer comprising a metal silicide, such as tungsten silicide, titanium silicide, or cobalt silicide, overlying a polysilicon layer.

Capping layer 18 is formed over conductive interconnects 1501–1503. Capping layer 18 typically has an etch rate that is dissimilar to silicon dioxide. However, in some specific embodiments, the capping layer 18 can be an oxide layer formed using tetraethylorthosilicate (TEOS) as a source gas. The capping layer 18 can include a plurality of films. The capping layer 18 is typically a silicon nitride film and has a thickness in the range of approximately 70–150 nanometers.

Spacers 19 are formed adjacent the sidewalls of the gate electrode 14 and conductive interconnects 1501–1503. They are typically formed from a silicon nitride layer having a thickness in a range of 50–80 nanometers that has been anisotropically etched. Alternatively, spacers 19 can be formed from a CVD deposited oxide, such as TEOS, or other materials suitable for use as sidewall spacers. The combination of the capping layer 18 and sidewall spacers 19 form a composite insulating layer overlying the conductive interconnects 1501–1503. A self-aligned suicide (salicide) process can optionally be performed to form silicided regions over exposed portions of gate electrode 14 and over exposed doped regions 16 in the semiconductor substrate 10.

Figure 2:
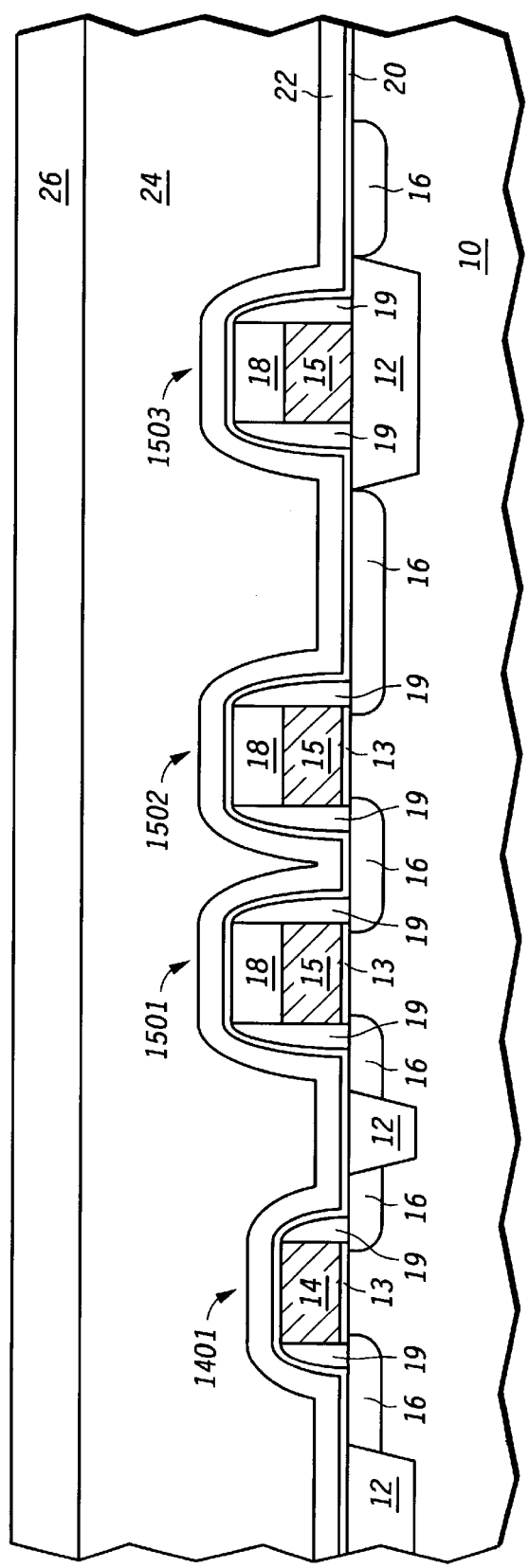
FIG. 2 includes an illustration of the cross-sectional view shown in FIG. 1 after forming dielectric films over the semiconductor substrate, gate electrode, and first level of conductive interconnects.

FIG. 2 includes an illustration of the semiconductor device substrate shown in FIG. 1 and further includes insulating layers 20, 22, 24, and 26 formed sequentially over the substrate 10, gate electrode 14, and first level of conductive interconnects 1501–1503. In one embodiment, insulating layer 20 is a layer of plasma-deposited oxide, which is formed using TEOS as a source gas. Alternatively, insulating layer 20 can be a layer of silicon nitride, a layer of phosphosilicate glass (PSG), a layer of borophosposilicate glass (BPSG), a silicon oxynitride layer, a polyimide layer, a low dielectric constant insulator, or the like. For the purposes of this specification, a low dielectric constant insulator has a dielectric constant of less than approximately 3.5. In addition, a combination of the foregoing dielectric materials can also be used to form insulating layer 20. Insulating layer 20 typically has a thickness of less than approximately 50 nanometers, and more typically has a thickness in a range of approximately 15 to 40 nanometers.

Insulating layer 22 is formed overlying insulating layer 20 and can be formed as a layer of silicon nitride having a graded nitrogen concentration. The thickness of insulating layer 22 is typically in a range of approximately 50 to 100 nanometers. In one embodiment, insulating layer 22 is formed using a flash plasma enhanced nitride (flash PEN) process. In this process, a conventional plasma enhanced nitride process is used at the beginning of the process. At least one nitrogen source gas (nitrogen ($N_2$), ammonia ($NH_3$), or the like) and a semiconductor source gas (silane ($SiH_4$), disilane ($Si_2H_6$), chlorinated silanes or disilanes, or the like) are flowing during the first part of the flash PEN deposition process. Typically silane, nitrogen, and ammonia are flowed during the first part of the flash PEN deposition process.

During the last part of the flash PEN deposition process, instead of terminating the semiconductor source gas flow before, or at the same, the nitrogen source gas flow is terminated, the semiconductor source gas flow is terminated after terminating the nitrogen source gas flow. The time difference between the termination of the two gas flows is typically in a range of approximately 0.5 to 15 seconds, and more usually is in a range of approximately 1 to 7 seconds. During this time, the nitrogen source gas in the reactor is being depleted while the semiconductor source gas continues to flow. The resulting insulating layer 22, correspondingly has a graded composition that includes a higher semiconductor (i.e., silicon) concentration at the surface of the insulating layer. The increased silicon concentration at the surface of the insulating layer provides better etch selectively as compared to overlying insulating layer 24.

Alternatively, the graded silicon nitride film can be replaced by a semiconductor-rich nitride film (i.e., silicon-rich silicon nitride) having a substantially uniform composition throughout its thickness and formed using conventional methods. Alternatively,insulating layer 22 can be a layer of silicon nitride, a layer of PSG, a layer of BPSG, a silicon oxynitride layer, a polyimide layer, a low dielectric constant insulator, or the like. In addition, a combination of the foregoing dielectric materials can also be used to form insulating layer 22.

Insulating layer 24 is deposited overlying insulating layer 22. In one embodiment, insulating layer 24 includes doped oxide. In one specific embodiment, this layer can be formed using TEOS, oxygen, trimethyl borate (TMB), and trimethyl phosphite (TMPi) to form a borophosphosilicate glass. Alternatively, insulating layer 24 can be a layer of undoped oxide, a layer of silicon nitride, a layer of PSG, a layer of BPSG, a silicon oxynitride layer, a polyimide layer, a low dielectric constant insulator, or the like. In addition, a combination of the foregoing dielectric materials can also be used to form insulating layer 24. The thickness of insulating layer 24 is initially 600 to 1200 nanometers after being deposited. Portions of insulating layer 24 are then polished back to planarize the surface of the substrate. During the polishing process, approximately 300 to 500 nanometers of the insulating layer 24, at the uppermost elevations, is removed.

Insulating layer 26 is deposited overlying insulating layer 24. In one embodiment, insulating layer 26 is a layer of plasma-deposited oxide that is formed using TEOS as a source gas. Alternatively, insulating layer 26 can be a layer of silicon nitride, a layer of PSG, a layer of BPSG, a silicon oxynitride layer, a polyimide layer, a low dielectric constant insulator, or the like. In addition, a combination of the foregoing dielectric materials can also be used to form insulating layer 26. The thickness of insulating layer 26 is approximately 100 to 250 nanometers.

Figure 3:
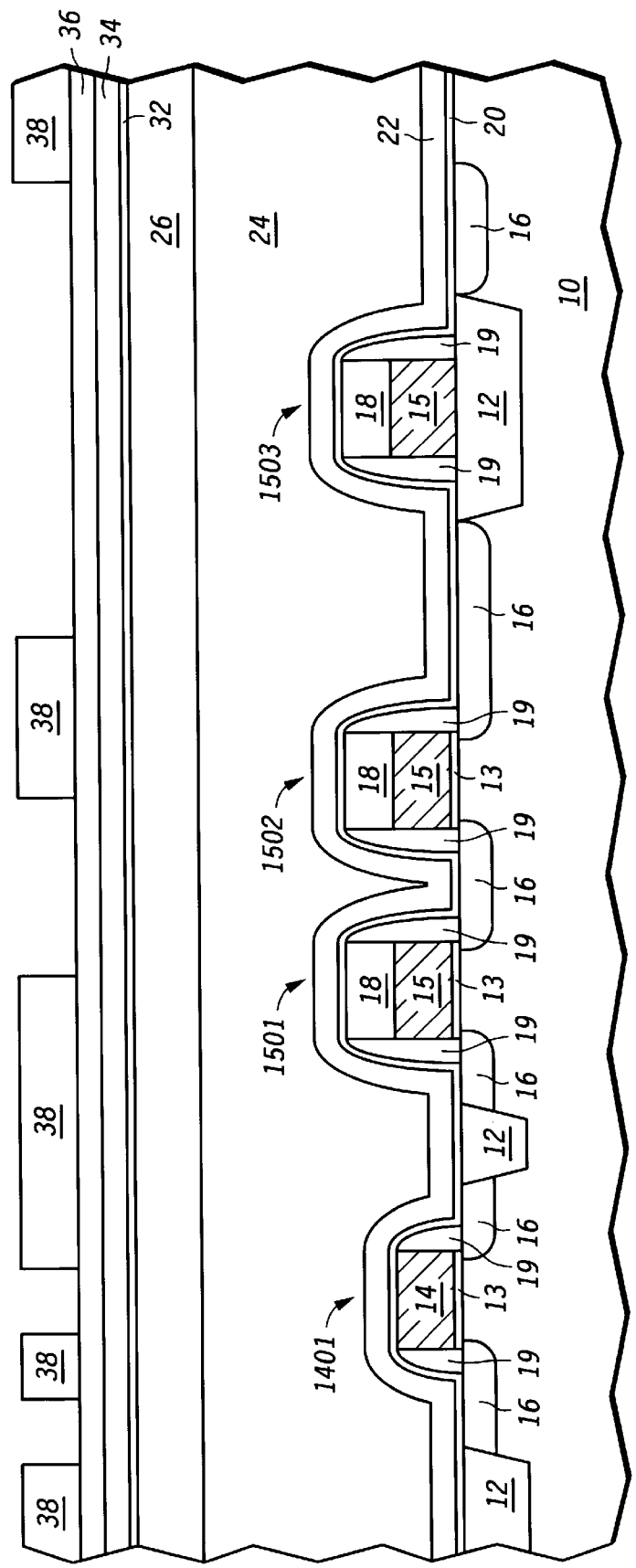
FIG. 3 includes an illustration of the cross-sectional view shown in FIG. 2 after forming an adhesion layer, an etch stop layer, an antireflective layer, and a patterned resist layer.

FIG. 3 includes an illustration of the semiconductor device substrate shown in FIG. 1, and further includes, in accordance with embodiments of the present invention, an adhesion layer 32, a hardmask layer 34, an antireflective layer 36, and a patterned resist layer 38. In one embodiment, adhesion layer 32 is a layer of silicon nitride. The thickness of adhesion layer 32 is typically in a range of 3–8 nanometers. In one embodiment, the silicon nitride is deposited as a plasma enhanced nitride (PEN) using a parallel plate plasma enhanced CVD (PECVD) chamber. Typically, a nitrogen source gas (nitrogen ($N_2$), ammonia ($NH_3$), or the like) and a semiconductor source gas (silane ($SiH_4$), disilane ($Si_2H_6$), chlorinated silanes or disilanes, or the like) are used to form the adhesion layer 32.

In one embodiment, silane, nitrogen and ammonia flow during the deposition process to form the adhesion layer 32. The ratio of silane to ammonia is in a range of approximately 0.6:1 to 0.9:1, and the ratio of nitrogen to ammonia is in a range of approximately 50:1 and 70:1. The chamber temperature is in a range of approximately 380–410 C., chamber pressure is maintained in a range of approximately 3.8–4.8 Torr, and chamber power is in a range of approximately 300–700 Watts. The deposition time is adjusted accordingly to achieve the desired film thickness. The adhesion layer 32 has an intrinsic stress between 120 Mega Pascals tensile and 120 Mega Pascals compressive and has a bulk total hydrogen content of less than approximately 18 atomic percent.

Hardmask layer 34 is formed overlying adhesion layer 32. In one embodiment, hardmask layer 34 consists essentially of silicon. The thickness of hardmask layer 34 is in a range of approximately 15–45 nanometers. In one embodiment, the hardmask layer 34 is a layer of PECVD deposited silicon. In one specific embodiment, the hardmask layer 34 is formed in a parallel plate PECVD chamber using a flash silicon deposition process. This process is described as follows. Typically, silane is flowed as the source gas; the silane gas flow rate is typically in a range 1.2–2.5 times greater than the gas flow rate of the silane during the PECVD process used to form the adhesion layer 32. The chamber temperature is in a range of approximately 380–410° C., chamber pressure is maintained in a range of approximately 1.5–3.0 Torr, and chamber power is in a range of approximately 400–650 Watts. The deposition time is adjusted accordingly to achieve the desired silicon thickness.

Alternatively, hardmask layer 34 can be formed using other materials, such as titanium, titanium dioxide, titanium nitride, tantalum, tantalum nitride, and the like, and using other deposition processes, such as a rapid thermal nitride (RTN) deposition process and the like. The hardmask layer 34 is used to define features during subsequent etch processing. In addition, the optical absorbtivity of the hardmask layer 34 can be adjusted, by varying its thickness, to reduce the amount of incidental reflected radiation.

Antireflective layer 36 is formed overlying hardmask layer 34. The thickness of antireflective layer 36 is in a range of approximately 15–45 nanometers. In one embodiment antireflective layer 36 is a layer of silicon-rich silicon oxynitride (SION) deposited in a parallel plate PECVD system using silicon, nitrogen, and oxygen source gases.

In one specific embodiment, silane, nitrogen, and nitrous oxide are flowed during the deposition process to form the antireflective layer 36. The ratio of silane to nitrous oxide is in a range of approximately 2.5:1 and 4.5:1, and the ratio of nitrogen to nitrous oxide is in a range of approximately 35:1 and 65:1. The chamber temperature is in a range of approximately 380–410° C., chamber pressure is maintained in a range of approximately 4.2–5.8 Torr, and chamber power is in a range of approximately 300–600 Watts. The deposition time is adjusted accordingly to achieve the desired film thickness. The adhesion layer 32 has an intrinsic stress that is maintained between 120 Mega Pascals tensile and 120 Mega Pascals compressive and has a bulk total hydrogen content of less than approximately 22 atomic percent.

Antireflective layer 36 improves the lithography process by reducing the amount of radiation reflected from underlying films and features during the exposure process, thereby reducing resist thickness swing effects and improving critical dimension control. The deposition of layers 32, 34, and 36 can be formed within a single PECVD processing chamber or formed within different processing chambers. A resist layer 38 is formed overlying the antireflective layer 36. The resist layer 38 is patterned to define openings that expose a surface portion of the antireflective layer. These openings will subsequently be used in forming local interconnect structures.

Figure 4:
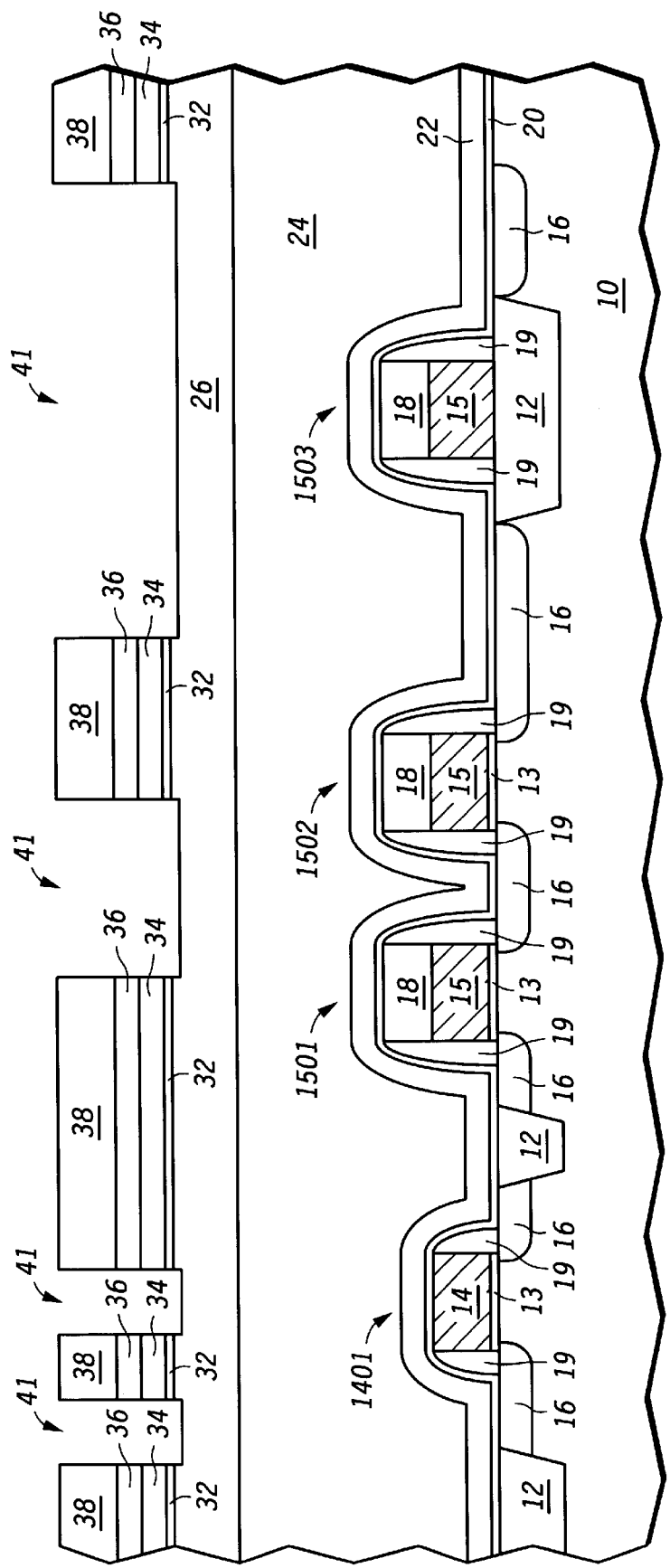
FIG. 4 includes an illustration of the cross-sectional view shown in FIG. 3 after performing an etch processing operation.

FIG. 4 further illustrates the semiconductor device substrate shown in FIG. 3 after partially etching feature openings. Shown in FIG. 4 are openings 41 that have been etched through the antireflective layer 36, the hardmask layer 34, the adhesion layer 32, and into insulating layer 26 to expose a surface portion of the insulating layer 26. The etch process used to define opening 41 is typically performed using a multi-step etching process.

The first etch step removes unpatterned portions of the antireflective layer 36. The process pressure for this etch step is in a range of approximately 150 to 250 millitorr (mT), and the radio frequency (RF) power is in a range of approximately 800 to 1200 Watts (W). A combination trifluoromethane ($CHF_3$), carbon tetrafluoride ($CF_4$), and argon (Ar) are used during this processing step. The $CHF_3$ is flowed in a range of approximately 20 to 40 standard cubic centimeters per minute (sccm), $CF_4$ is flowed in a range of approximately 20 to 40 sccm, and Ar is flowed in a range of approximately 40 to 60 sccm.

The second etch step removes unpatterned portions of hardmask layer 34 and adhesion layer 32. The process pressure for this etch step is in a range of approximately 70 to 110 mT, and the RF power is in a range of approximately 300 to 600 W. $CF_4$ is used for this processing step and is flowed in a range of approximately 20 to 40 sccm.

All other etching parameters during the etch to define openings 41 are conventional. The etching steps are characterized as reactive ion etching. Upon completion of the etch, the openings 41, as shown in FIG. 4, are formed.

Figure 5:
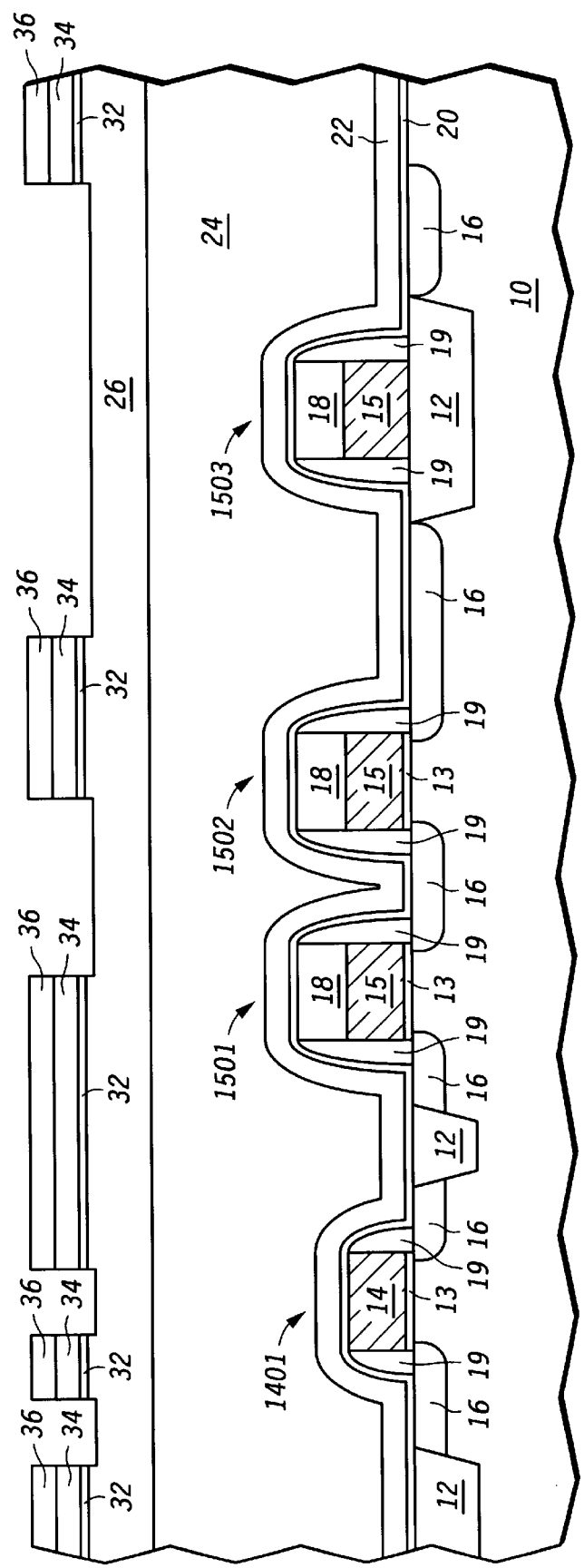
FIG. 5 includes an illustration of the cross-sectional view shown in FIG. 4 after removing the resist layer.

In accordance with an embodiment of the present invention, the resist layer 38 is then optionally removed, as shown in FIG. 5. The removal of the resist layer 38 can be accomplished using a molecular oxygen ($O_2$) plasma in the same reactive ion etch (RIE) processing chamber used to etch the antireflective layer 36, the hardmask layer 34, and the adhesion layer 32, or it can be performed in a separate RIE processing chamber. Alternatively, the resist layer 38 can be removed using wet processing chemistries or a combination of both plasma and wet processing chemistries. Removal of the resist layer 38, prior to continuing the etch, improves the quality of the subsequent etch processing steps.

Figure 6:
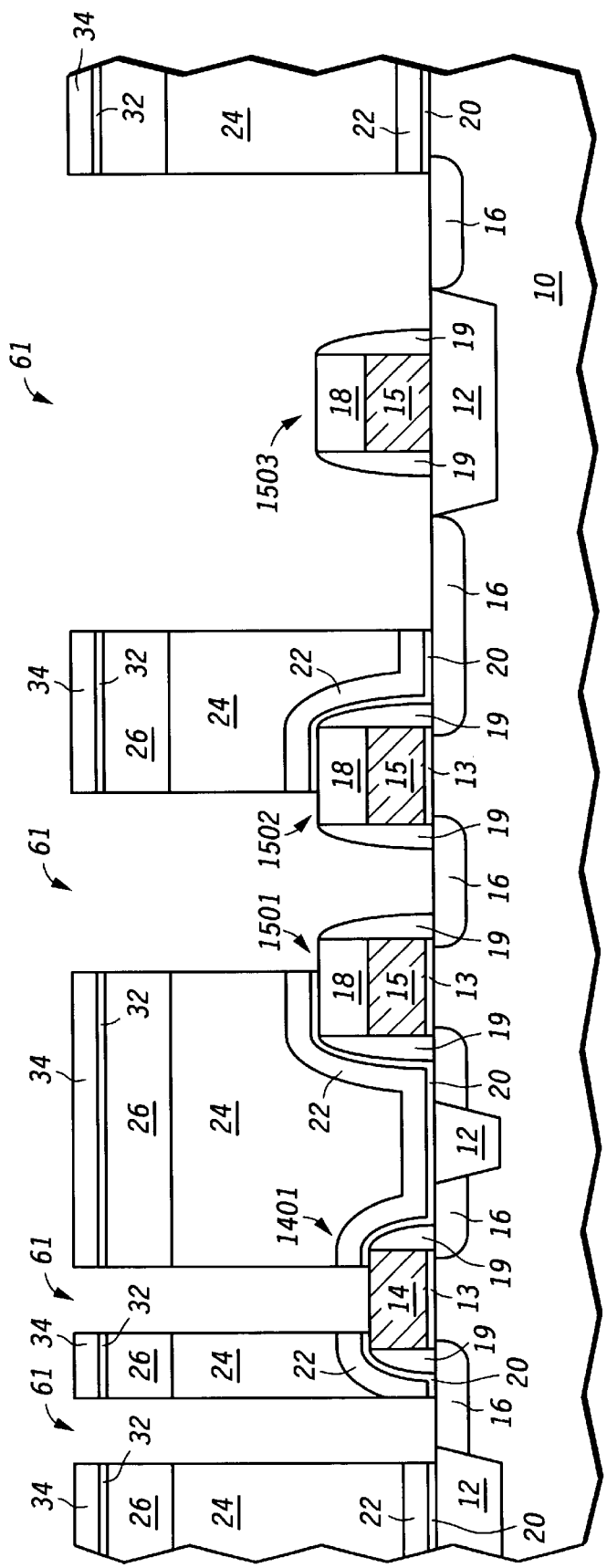
FIG. 6 includes an illustration of the cross-sectional view shown in FIG. 5 after performing an etch processing operation.

FIG. 6 includes an illustration of the semiconductor device substrate shown in FIG. 5 after completing the etch to define the openings 61. The etch process used to define the openings 61 is typically performed using a multi-step etch process and is optionally performed as a continuation of the etch process used to define opening 41 and remove resist layer 38.

During the etch, hardmask layer 34 is used to define the patterned features. As illustrated in FIG. 6, the antireflective layer 36 is also etched during the etching process to define the openings 61. Exposed portions of antireflective layer 36 are etched after the resist has been removed using one of the resist removal methods described previously or, alternatively, after erosion of the resist during the etch. The first etch step to define the openings 61 removes exposed portions of the insulating layer 26. The process pressure for this etch step is in a range of approximately 150 to 300 mT, and the RF power is in a range of approximately 900 to 1300 W. A combination of $CHF_3$, $CF_4$, and Ar are used for this processing step. The $CHF_3$ is flowed in a range of approximately 35 to 60 sccm, $CF_4$ is flowed in a range of approximately 3 to 10 sccm, and Ar is flowed in a range of approximately 50 to 70 sccm.

The next etch step removes exposed portions of the insulating layer 24. The process pressure for this etch step is in a range of approximately 40 to 60 mT, and the RF power is in a range of approximately 900 to 1300 W. A combination of octofluorobutene ($C_4F_8$), carbon monoxide (CO), and Ar are used for this processing step. The $C_4F_8$ is flowed in a range of approximately 5 to 10 sccm, CO is flowed in a range of approximately 20 to 40 sccm, and Ar is flowed in a range of approximately 125 to 175 sccm.

The next etch step removes exposed portions of the insulating layer 22. The process pressure for this etch step is in a range of approximately 50 to 70 mT, and the RF power is in a range of approximately 175 to 275 W. A combination of $CHF_3$ and $O_2$ are used for this processing step. The $CHF_3$ flows in a range of approximately 5 to 10 sccm, and the $O_2$ flows in a range of approximately 30 to 50 sccm.

The final etch step removes exposed portions of the insulating layer 20. The process pressure for this etch step is in a range of approximately 150 to 250 mT, and the RF power is in a range of approximately 900 to 1300 W. A combination of $C_4F_8$, $CF_4$, Ar and CO are used for this processing step. The $C_4F_8$ is flowed in a range of approximately 5 to 10 sccm, the $CF_4$ is flowed in a range of approximately 5 to 10 sccm, the Ar is flowed in a range of approximately 125 to 175 sccm and CO is flowed in a range of approximately 20 to 40 sccm.

All other etching parameters during the etch to define opening 61 are conventional. All etching steps are characterized as reactive ion etching. Upon completion of the etch, the openings 61, as shown in FIG. 6, are formed.

Figure 7:
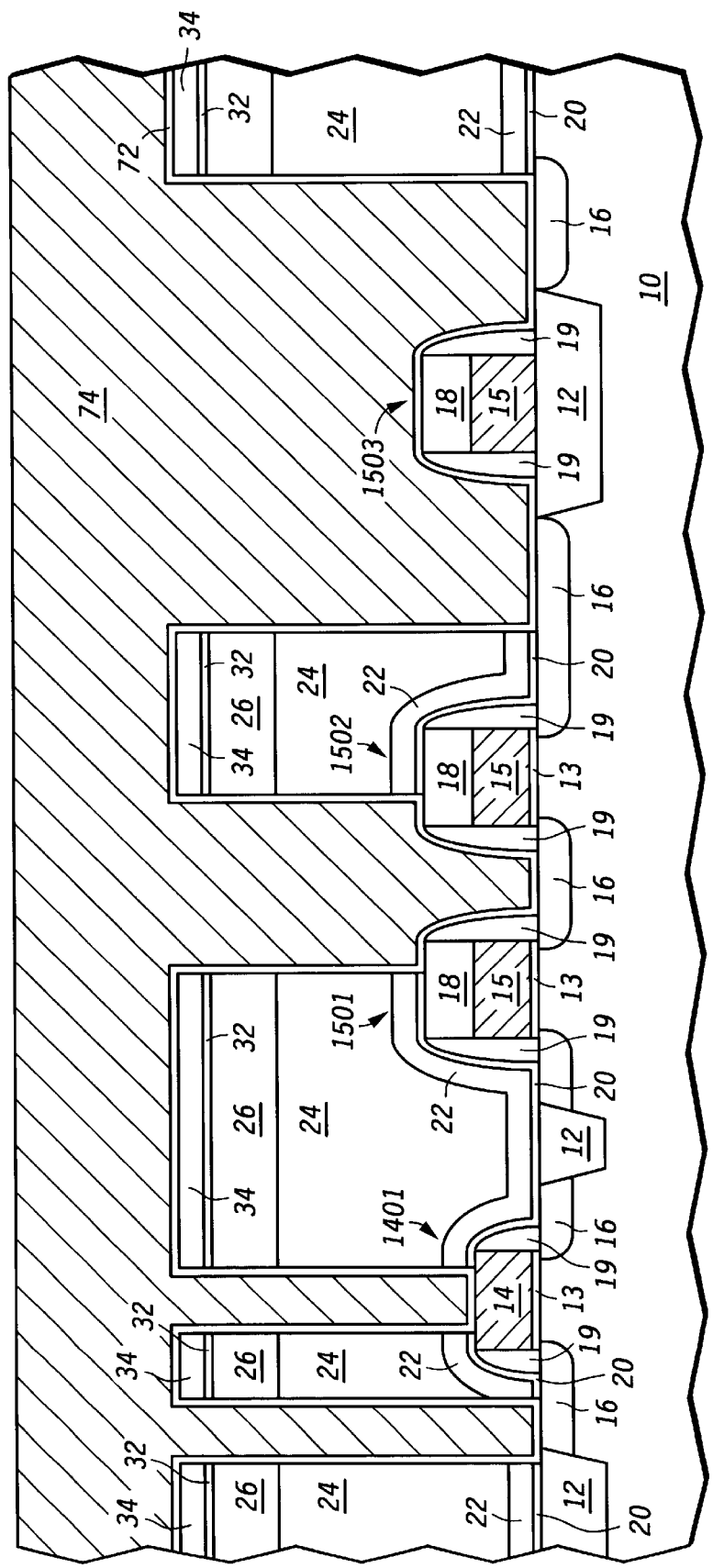
FIG. 7 includes an illustration of the cross-sectional view shown in FIG. 6 after forming a conductive material over the substrate.

As illustrated in FIG. 7, an adhesion/barrier film 72 and conductive film 74 are formed over the substrate 10 and within the openings 61. The adhesion/barrier film includes one or more conductive materials, such as tantalum, tantalum nitride, tantalum/tantalum nitride, titanium/titanium nitride, and the like. The conductive film 74 includes a conductive material such as tungsten, doped silicon, aluminum, copper, and the like. The adhesion/barrier film 72 and conductive film 74 are typically formed by sputter deposition, chemical vapor deposition, electroplating, electroless plating, or a combination thereof. Following the deposition of the conductive film 74, and prior to depositing any subsequent insulating layer, the substrate is polished to remove portions of the adhesion/barrier film 72 and conductive film 74 that lie outside the opening 61 and, optionally, the remaining portions of hardmask layer 34 and adhesion layer 32, near the top of the openings 61 as illustrated in FIG. 8.

In one embodiment, the films are removed using a two step chemical mechanical polishing (CMP) process consisting of a polish step and a buff step. The polish step is conducted on a CMP system's primary platen using a downforce pressure in a range of approximately 14–41 kilopascals (two to six pounds per square inch) and backside air pressure of approximately 7–34 kilopascals (one to five pounds per square inch). The platen speed is in a range of approximately 40–60 revolutions per minute and the carrier speed is a range of approximately 40–60 revolutions per minute. The slurry flowrate is in a range of approximately 40 to 60 milliliters per minute.

A buff step is conducted on the system's final platen using a downforce pressure in a range of approximately 0–34 kilopascals (zero to five pounds per square inch) and a backside air pressure in a range of approximately 0–34 kilopascals (zero to five pounds per square inch). The platen speed is in a range of 15–25 revolutions per minute and carrier speed is in a range of approximately 15–25 revolutions per minute. The slurry flowrate is in a range of approximately 100–200 milliliters per minute.

Figure 8:
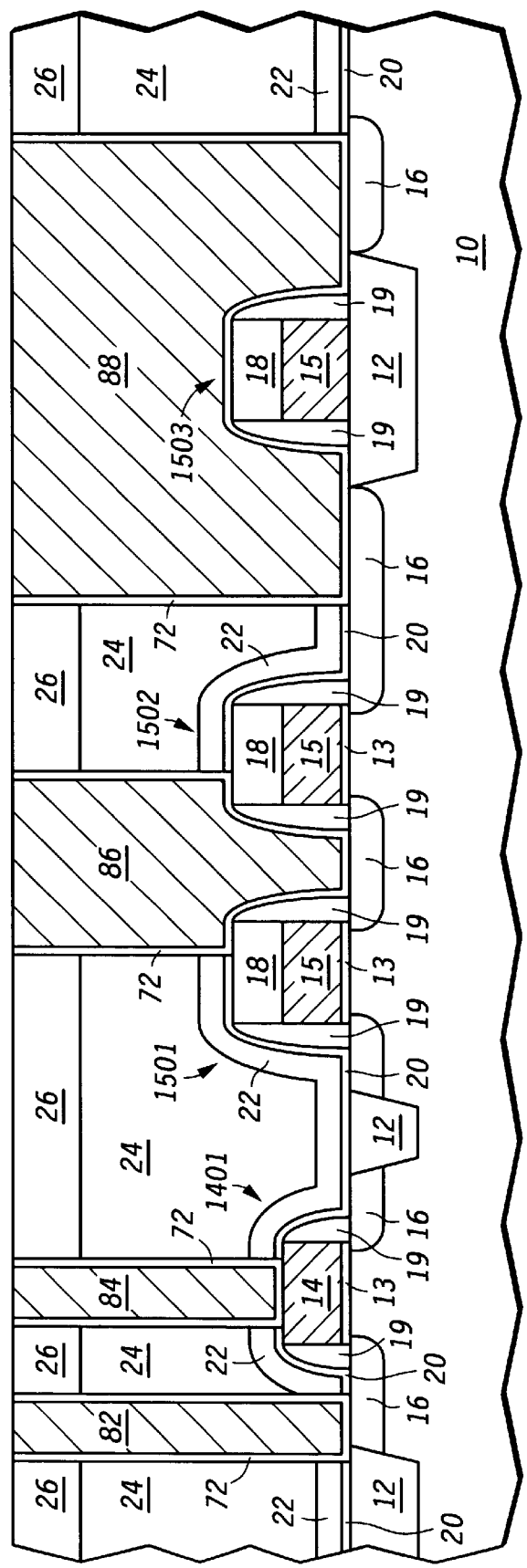
FIG. 8 includes an illustration of a cross-sectional view shown in FIG. 7 after removing portions of the conductive material.

After completing the polishing operation, the interconnect members 82, 84, 86 and 88 have been formed as illustrated in FIG. 8. Interconnect member 82 provides an electrical connection to a source or drain region of transistor 1401. Interconnect member 84 provides an electrical connection to the gate electrode of transistor 1401. Interconnect member 86 provides a self-aligned contact electrical connection to the doped region 16 between conductive interconnects 1501 and 1502, and interconnect member 88 provides a self-aligned local interconnect (SALI) electrical connection between the diffuse doped regions 16 adjacent conductive interconnect 1503.

Figure 9:
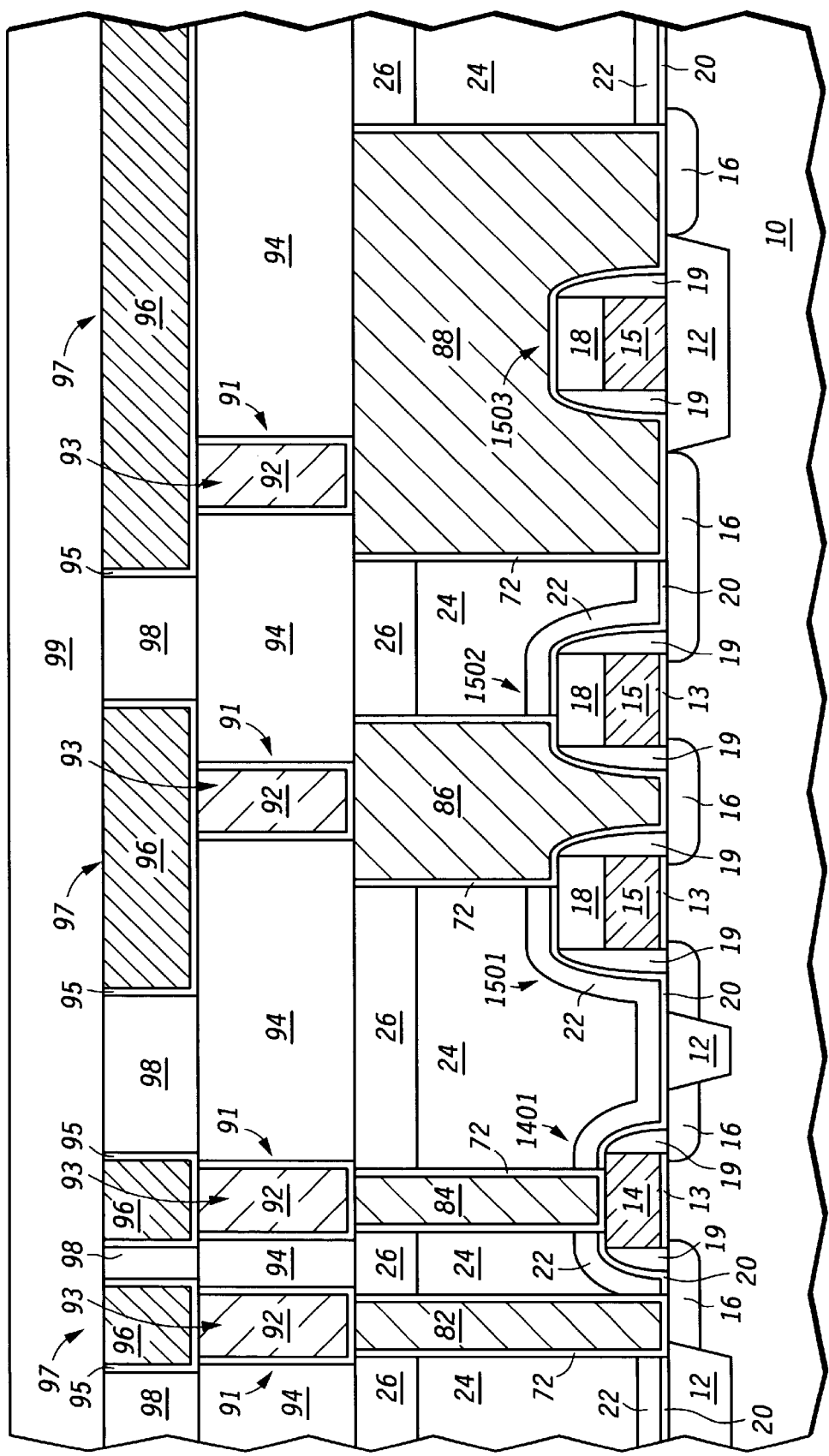
FIG. 9 includes an illustration of a cross-sectional view shown in FIG. 8 after forming a substantially completed device.

In FIG. 9, the semiconductor substrate shown in FIG. 8 has been processed to further include an insulating layer 94, vias 93, an insulating layer 98, inlaid interconnect structures 97, and a passivation layer 99. If necessary, or so desired, a hardmask layer, antireflective layer, and optional adhesion layer, similar to those described to form hardmask layer 34, antireflective layer 36, and adhesion layer 32 can be used in conjunction with insulating layer 94 to form the openings for the vias 93. After forming the openings, an adhesion/barrier film 91 and conductive film 92 are deposited within the openings and then polished back to form the vias 93, as illustrated in FIG. 9.

Similarly, a hardmask layer, antireflective layer, and optional adhesion layer, similar to those described to form hardmask layer 34, antireflective layer 36, and adhesion layer 32 can be used in conjunction with insulating layer 98 to form the openings for the inlaid interconnect structures 97. After forming the openings, an adhesion/barrier film 95 and conductive film 96 are deposited within the openings and then polished back to form the inlaid interconnect structures 97, as illustrated in FIG. 9.

A passivation layer 99 is then formed over the inlaid interconnects 97 and insulating layer 98. Other electrical connections are made to other portions of the semiconductor device but are not shown. Additional interlevel dielectric layers and interconnects can be formed if needed. The passivation layer 99 is formed overlying the uppermost interconnect level.

In alternate embodiments using advanced lithographic processes, such as X-ray lithography which operates at a wavelength in a range of approximately 0.8 to 1.5 nanometers, extreme ultraviolet (EUV) lithography which operates at a wavelength of approximately 13 nanometers, electron beam lithography which exposes resist with electrons, or ion beam lithography which exposes resist with charged particles, variations of the previously described embodiments can be incorporated to obtain similar patterning and etching benefits. In one such embodiment, an optional adhesion layer and hardmask layer are formed using processes similar to those described to form adhesion layer 32 and hardmask layer 34.

The PEN film used to form the antireflective layer 36 is optionally replaced with an oxide film. The oxide film, in addition to any radiation absorbing benefit, provides a processing integration benefit by inhibiting chemical interactions between the hardmask layer 34 and subsequently deposited X-ray, EUV, electron beam or ion beam resists. In one embodiment, the oxide layer is formed using a conventional plasma enhanced chemical vapor deposition process and the thickness of the oxide layer is in a range of approximately 5–30 nanometers. Or alternatively, in embodiments, where reflectivity and chemical interactions do not pose serious process integration concerns, the antireflective layer is not used.

Embodiments of the present invention provide several advantages over the prior art. First, the combined radiation absorbing properties of the antireflective layer 36 and the hardmask layer 34 minimize problems with reflected radiation associated with underlying substrate topography and varying film composition. This allows for improved overall quality and reproducibility of the patterned resist features.

Second, the hardmask layer 34 provides patterning protection during the bulk of the etch through the insulating layers 20, 22, 24, and 26. The resist layer is only used to define the initial feature opening through the antireflective layer 36 and the hardmask layer 34. Since the thickness of the antireflective layer 36 and the hardmask layer 34 is significantly less than that of the insulating layers 20, 22, 24, and 26, the etch time to define the initial feature opening is considerably less than the etch time to form the opening through the insulating layers 20, 22, 24, and 26. This reduces the resist thickness requirements for defining the initial feature opening and correspondingly reduces the depth of focus and exposure time of the lithography process. It also facilitates the patterning of finer resist features.

Third, the nature of the plasma enhanced chemical vapor deposition processes used to form hardmask layer 34, antireflective layer 36, and the optional adhesion layer 32, are such that they are easily incorporated onto a single PECVD processing platform. Moreover, the depositions can be performed in the same plasma enhanced chemical vapor deposition chamber during a single deposition processing sequence.

In addition, since the resist layer 38 can be removed prior to completing the etch, the overall aspect ratio of the feature opening is reduced, thereby easing the etch processing requirements. Also, the hardmask layer 34 provides improved etch resistance and is less prone to erosion as compared to conventional resist. This results in reduced sidewall erosion of the feature opening during the etch and improves the ability to control the sidewall profile and the critical dimensions at the top and bottom of the feature openings. Furthermore, the etching processes to define the opening, including the resist removal step, can be integrated onto a single etch processing platform. Moreover, the etch processes can be performed in the same etch chamber during a single etch processing sequence.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that can cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but can include other elements not expressly listed or inherent to such process, method, article, or apparatus.

What is claimed is:

1. A process for forming a semiconductor device comprising: forming an insulating layer over a semiconductor device substrate;
    forming an adhesion layer comprising silicon over the insulating layer, wherein the adhesion layer has a thickness in a range of 3–8 nanometers;
    forming a silicon hardmask layer over the adhesion layer;
    forming a silicon oxynitride antireflective layer overlying the silicon hardmask layer;
    forming a resist layer overlying the silicon oxynitride antireflective layer;
    forming an opening in the resist layer to form an exposed surface portion of the silicon oxynitride antireflective layer;
    etching the exposed surface portion of the silicon oxynitride antireflective layer and a portion of the silicon hardmask layer to form an exposed surface portion of the insulating layer; and
    etching the exposed surface portion of the insulating layer to form a feature opening in the insulating layer.

2. The process of claim 1, wherein the adhesion layer comprises silicon nitride.

3. The process of claim 1, wherein the silicon hardmask layer has a thickness in a range of approximately 15–45 nanometers.

4. The process of claim 1, wherein the silicon oxynitride antireflective layer has a thickness in a range of approximately 15–45 nanometers.

5. The process of claim 1, wherein the adhesion layer has an intrinsic stress between 120 Mega Pascals compressive and 120 Mega Pascals tensile.

6. The process of claim 1, wherein forming the silicon hardmask layer and forming the silicon oxynitride antireflective layer are performed in a same plasma enhanced chemical vapor deposition system during a single deposition processing sequence.

7. The process of claim 1, further comprising removing the resist layer after etching the exposed surface portion of the silicon oxynitride antireflective layer and before etching the exposed surface portion of the insulating layer.

8. The process of claim 1, wherein etching the exposed surface portion of the silicon oxynitride antireflective layer and etching the exposed surface portion of the insulating layer are performed in a same etch chamber during a single etch processing sequence.

9. The process of claim 8, further comprising removing the resist layer after etching the exposed surface portion of the silicon oxynitride antireflective layer and before etching the exposed surface portion of the insulating layer.

10. The process of claim 1, further comprising:

depositing a conductive material over the semiconductor device substrate to fill the feature opening; and removing portions of the conductive material.

11. The process of claim 10, wherein removing portions of the conductive material also removes portions of the silicon hardmask layer.

12. A process for forming a semiconductor device comprising: forming an insulating layer over a semiconductor device substrate;

forming an adhesion layer comprising silicon over the insulating layer, wherein the adhesion layer has a thickness in a range of 38 nanometers;

forming a silicon hardmask layer over the insulating layer, wherein the silicon hardmask layer has a thickness in a range of approximately 15–45 nanometers;

forming a silicon oxynitride antireflective layer overlying the silicon hardmask layer wherein the silicon oxynitride antireflective layer has a thickness in a range of approximately 15–45 nanometers;

forming a resist layer overlying the silicon oxynitride antireflective layer;

forming an opening in the resist layer to form an exposed surface portion of the silicon oxynitride antireflective layer;

etching the exposed surface portion of the silicon oxynitride antireflective layer and a portion of the silicon hardmask layer to form an exposed surface portion of the insulating layer;

etching the exposed surface portion of the insulating layer to form an interconnect opening in the insulating layer; and forming an interconnect within the interconnect opening.

13. The process of claim 12, wherein the adhesion layer comprises silicon nitride.

14. The process of claim 12, wherein the adhesion layer has an intrinsic stress between 120 Mega Pascals compressive and 120 Mega Pascals tensile.

15. A process for forming a semiconductor device comprising:

forming an insulating layer over a semiconductor device substrate;

forming an adhesion layer comprising silicon over the insulating layer;

forming a silicon hardmask layer over the adhesion layer;

forming a plasma enhanced nitride antireflective layer overlying the silicon hardmask layer, wherein forming the adhesion layer, the silicon hardmask layer, and the nitride antireflective layer are performed in a same plasma enhanced chemical vapor deposition chamber during a single deposition processing sequence;

forming a resist layer overlying the nitride antireflective layer;

forming an opening in the resist layer to form a first exposed surface portion of the nitride antireflective layer;

etching the first exposed surface portion of the nitride antireflective layer, portions of the silicon hardmask layer, and portions of the adhesion layer to form an exposed surface portion of the insulating layer;

removing the resist layer;

etching the exposed surface portion of the insulating layer and a second exposed surface of the nitride antireflective layer to form an opening in the insulating layer and remove portions of the second exposed surface of the nitride antireflective layer;

depositing a conductive material over the semiconductor device substrate to fill the opening; and removing the silicon hardmask layer, the adhesion layer, and portions of the conductive material lying outside the opening.

16. The process of claim 15, wherein the adhesion layer comprises silcon nitride.

17. The process of claim 15, wherein the silicon hardmask layer has a thickness in a range of approximately 15–45 nanometers.

18. The process of claim 15, wherein the nitride antireflective layer has a thickness in a range of approximately 15–45 nanometers.

19. The process of claim 15, wherein the adhesion layer has an intrinsic stress between 120 Mega Pascals compressive and 120 Mega Pascals tensile.

20. The process of claim 15, wherein etching the first exposed surface portion of the nitride antireflective layer, removing the resist layer, and etching the exposed surface portion of the insulating layer are all performed in a same processing chamber during a single processing sequence.

* * * * *

UNITED STATES PATENT AND TRADEMARK OFFICE
CERTIFICATE OF CORRECTION

PATENT NO.    : 6,287,951 B1
DATED         : September 11, 2001
INVENTOR(S)   : Kevin D. Lucas et al.

It is certified that error appears in the above-identified patent and that said Letters Patent is hereby corrected as shown below:

<u>Column 11,</u>
Line 22, change "38" to -- 3 – 8 --

Signed and Sealed this

Eighteenth Day of March, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,287,951 B1                                              Page 1 of 1
DATED        : September 11, 2001
INVENTOR(S)  : Kevin d. Lucas et al.

It is certified that error appears in the above-identified patent and that said Letters Patent is hereby corrected as shown below:

<u>Column 11,</u>
Line 22, change "38" to -- 3 – 8 --

Signed and Sealed this

Fifteenth Day of April, 2003

JAMES E. ROGAN
*Director of the United States Patent and Trademark Office*